United States Patent [19]
Lee

[11] Patent Number: 6,105,161
[45] Date of Patent: Aug. 15, 2000

[54] ERROR DATA CORRECTION CIRCUIT

[75] Inventor: Yun Gi Lee, Daejeon, Rep. of Korea

[73] Assignee: LG Semicon Co., Ltd., Cheongju, Rep. of Korea

[21] Appl. No.: 09/026,555

[22] Filed: Feb. 20, 1998

[30]        Foreign Application Priority Data

Mar. 20, 1997 [KR]   Rep. of Korea ........................ 97-9524

[51] Int. Cl.[7] ................................................. H03M 13/00
[52] U.S. Cl. ............................................................ 714/777
[58] Field of Search ................................... 714/224, 733, 714/734, 735, 736, 737, 738, 739, 777, 752; 365/201

[56]              References Cited

U.S. PATENT DOCUMENTS

| | | | |
|---|---|---|---|
| 4,532,629 | 7/1985 | Furuya | 714/755 |
| 4,646,312 | 2/1987 | Goldsbury | 714/763 |
| 4,710,934 | 12/1987 | Traynor | 714/765 |
| 4,958,352 | 9/1990 | Noguchi et al. | 714/704 |
| 5,012,472 | 4/1991 | Arimoto | 714/754 |

OTHER PUBLICATIONS

Modern Electronics Circuits Reference Manual, John Markus, MC Graw Hill, 1980, p. 172.

*Primary Examiner*—Albert De Cady
*Assistant Examiner*—Rudolph Hastick
*Attorney, Agent, or Firm*—Fleshner & Kim, LLP

[57]            ABSTRACT

An error data correction circuit is provided that increases data output speed. The error data correction circuit latches the output from an error data correction unit based on a latch control signal generated by combining a control signal and an error judgement signal to prevent noise. The circuit includes a latch control unit that combines an output from the error judgement unit and a latch signal to output a latch control signal. A latch circuit latches an output from the error data correction unit while the latch control signal is inputted from the latch control unit and generate a corrected output.

19 Claims, 4 Drawing Sheets

FIG.4
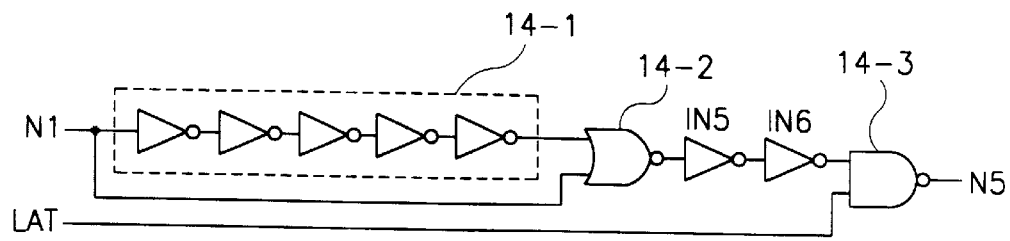
FIG.5A LAT 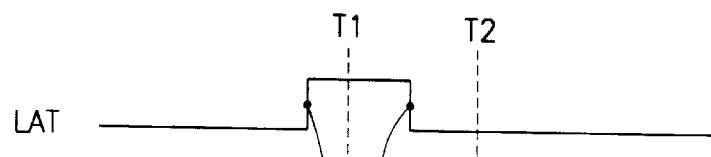
FIG.5B SA0 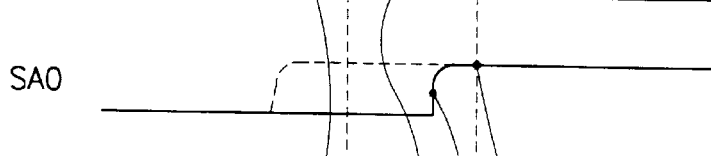
FIG.5C N1 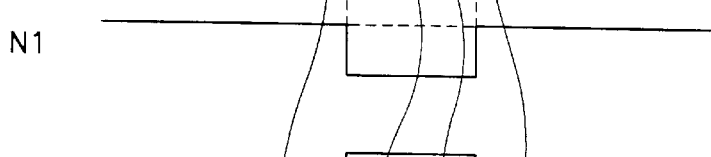
FIG.5D N3 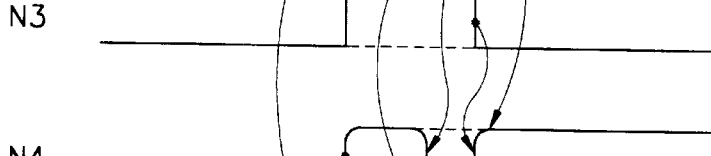
FIG.5E N4 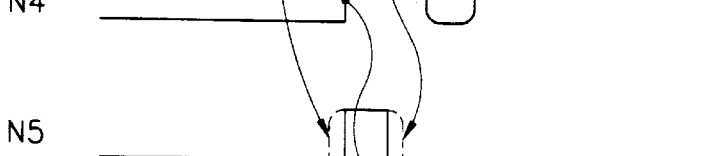
FIG.5F N5 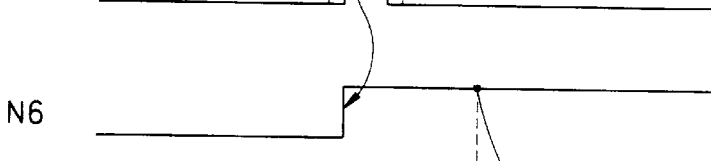
FIG.5G N6 
FIG.5H D0en 
FIG.5I D0

ERROR DATA CORRECTION CIRCUIT

BACKGROUND OF THE INVENTION

1. Field of the Invention

The present invention relates to data error, and in particular, to an error data correction circuit.

2. Background of the Related Art

The basic algorithm of a Hamming code uses a number (K+1) of parity bits when the number of data bits is $2^k$. For example, when the data is formed of 4-bits, (e.g., $2^2$-bits), the parity bits become 3-bits in number.

In addition, the parity bit coding method determines that a data bit is 1 in each of the 3-bit parity bits by generating a group and adding the parity bit to a $(2^n)$th position so that the number of 1s becomes 2n in the generated group. In other words, a table is formed by using 1st through 7th data bits based on the 4-bits of data and the 3-bit parity. In this case, the parity bits are bits 1, 2 and 4 (e.g., $2^0$, $2^1$ and $2^2$). Thereafter, 1st, 3rd, 5th, and 7th bits are grouped to determine the data bit is 1 in the first parity bit. The 2nd, 3rd, 6th, and 7th bits are grouped to determine whether the data bit is 1 in the second parity bit, and 4th, 5th, 6th, and 7th bits are grouped to determine whether the data bit is 1 in the third parity bit.

For example, if a data is 1011, the parity bit becomes 1st, 2nd, and 4th bits, so that one frame is formed of x, x, 1, x, 0, 1, and 1. Therefore, the parity bits are determined (e.g. by adding 1 or 0) so that the number of 1s becomes 2n in each parity group. In this manner, the 1st, 3rd, 5th, and 7th bits becomes 0, 1, 0, 1; the 2nd, 3rd, 6th, and 7th bits become 1, 1, 1, 1; and the 4th, 5th, 6th, and 7th bits become 0, 0, 1,1. Thus, the Hamming code final frame outputted from a sense amplifier is formed of seven bits being 0, 1, 1, 0, 0, 1, and 1.

In addition, an error detection method computes bit values of each parity group using an exclusive OR-gate. When the computed value is 0, it is judged that there is no error in the output from the sense amplifier. However, when the computed value is 1, it is judged that there is an error in the output from the sense amplifier.

In the case of 32 data bits (e.g., $2^5$ data bits), 6-bits are needed as parity bits. If a basic Hamming code is formed of 6-bits, the number of frames of a 6-bit parity is made different, so that it is difficult to form the logic of an exclusive OR-gate. Therefore, a modified Hamming code by that separates the bits 1 through 32 based on the different combinations on the assumption that there are two 1s or three 1s was disclosed. In the method, the error detection is performed in the same manner as the previous Hamming code method.

As shown in FIG. 1, the related art data correction circuit includes an error detection unit 10 for exclusively ORing outputs SA0 through SAn from a sense amplifier and for outputting error detection signals P0 through Pn. An error judgement unit 11 outputs an error judgement signal N1 based on the error detection signals P0 through Pn detected by the error detection unit 10. An error data correction unit 12 corrects the outputs SA0 through SAn from the sense amplifier in which an error occurred in accordance with the judgement signal N1 from the error judgement unit 11. An output buffer 13 outputs a data N4, which can be modified by the error data correction unit 12.

The error detection unit 10 is formed of exclusive OR-gates. The error judgement unit 11 includes a NOR-gate 11-1 for NORing only the data of 0 (zero) among the outputs from the error detection unit 10, and a NAND-gate 11-2, for NANDing only the data of 1 (one) among the outputs from the error detection unit 10.

The error data correction unit 12 includes a CMOS inverter 12-1 for inverting the output signals SA0 through SAn from the sense amplifier, a transmission gate 12-2 for transferring the output from the inverter 12-1 and a transmission gate 12-3. The transmission gate 12-3 transfers the output signals SA0 through SAn from the sense amplifier in accordance with the output from the NAND-gate 11-2, which was inverted by a CMOS inverter IN2. In addition, CMOS inverters IN3 and IN4 are coupled in series before an input to the output buffer 13.

The operation of the related art error data correction circuit will now be described. If the outputs SA0 through SAn from the sense amplifier (not shown) are normal, the outputs P0 through Pn from the error detection unit 10 are 0 (zero). Accordingly, the error judgement unit 11 outputs a high level error judgement signal N1.

Therefore, the transmission gate 12-3 of the error data correction unit 12 is turned on in accordance with a low level error judgement signal N1, which was inverted by the CMOS inverter IN2. Thus, the outputs SA0 through SAn from the sense amplifier are outputted through the transmission gate 12-3 and the CMOS inverters IN3 and IN4, respectively. The output buffer 13 receives the output from the error data correction unit 12, and outputs in accordance with an output enable signal DOen.

However, the output signal from the sense amplifier (not shown) may be delayed because of a process variation, etc., or an error data may be outputted. The delay of the output from the sense amplifier will now be described.

As shown in FIG. 2A, when the output SA0 from the sense amplifier (not shown) is delayed, the output from the error detection unit 10 becomes 1, and the outputs P1 through Pn become 0. In the drawings, broken lines denote a normal data output. In this case, the NOR-gate 11-1 of the error judgement unit 11 NORs the outputs P1 through Pn from the error detection unit 10, to output 1. Then, the NAND-gate 11-2 NANDs the output P0 from the error detection unit 10 and the output from the NOR-gate 11-1 to output a low level error judgement signal N1 at the time T1 as shown in FIG. 2B.

Since the transmission gate 12-2 of the error data correction unit 12 is turned on in accordance with a high level error judgement signal N1, which signal was inverted by the CMOS inverter IN2, the output SA0 from the sense amplifier is inverted by the CMOS inverter 12-1 and is outputted through the transmission gate 12-2. FIG. 2D illustrates the corrected output signal N4 from the transmission gate 12-2.

In addition, the output buffer 13 receives the corrected output N4 from the transmission gate 12-2 through the CMOS inverter IN3 and IN4. Accordingly, the output buffer 13 outputs the signal, as shown in FIG. 2F, in accordance with the output enable signal DOen as shown in FIG. 2E.

When the normal output SA0 from the sense amplifier is inputted at the time T2, the error judgement signal N1 becomes a high level. Then, the output SA0 from the sense amplifier is normally outputted through the transmission gate 12-3 and the inverters IN3 and IN4 to the output buffer 13.

As described above, in the related art error data correction circuit, when the outputs SA0 through SAn from the sense amplifier are delayed, an output from a corresponding amplifier in which the delay occurred is inverted and outputted. Then, when the signal from the sense amplifier is normally outputted, the non-inverted output from the sense amplifier is outputted. In addition, when the error data is outputted from the sense amplifier, the process is performed the same as the previous (delayed data) process.

Thus, the related art error data correction circuit has various disadvantages. When the output from the sense amplifier is delayed, the output of a transmission gate of the error data connection circuit is erroneously transited from a high level to a low level when the normal data actually arrives (e.g., between times T1 and T2 as shown in FIG. 2D). Then the output from the related art error correction circuit transmission gate transitions from the low level to a high level. Thus, the output buffer outputs a signal delayed by noise (glitch) as shown in FIG. 2F.

SUMMARY OF THE INVENTION

An object of the present invention is to provide an error data correction circuit that overcomes at least the problems encountered in the related art.

Another object of the present invention is to provide an error data correction circuit that increases data output speed.

A further object to the present invention is to provide an error data correction circuit that latches the output from an error data correction unit based on a latch control signal generated by an inner control signal and an error judgement signal.

A still further object of the present invention is to provide an error data correction circuit that prevents noise.

To achieve at least the above objects in a whole or in parts, there is provided an error data correction circuit that includes a latch control unit for combining an output from the error judgement unit and a latch signal to output a latch control signal, and a latch circuit for latching an output from the error data correction unit while a latch control signal is inputted from the latch control unit and outputting the output to the output buffer.

To further achieve the above objects in a whole or in parts, there is provided an error data correction circuit according to the present invention that includes an error judgement unit that receives an error detection signal based on input signal and outputs an error judgement signal, an error data correction unit that selectively corrects the input signal based on the error judgement signal, a latch control unit that outputs a latch control signal; a latch circuit that latches a corrected output from the error data correction unit based on the latch control signal from the latch control unit, and an output buffer that transmits the corrected output received from the latch control circuit.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 4 is a circuit diagram illustrating a latch control unit of FIG. 3; and

FIGS. 5A through 5I are diagrams illustrating waveforms signals of elements of FIG. 3.

DETAILED DESCRIPTION OF PREFERRED EMBODIMENTS

Figure 1:
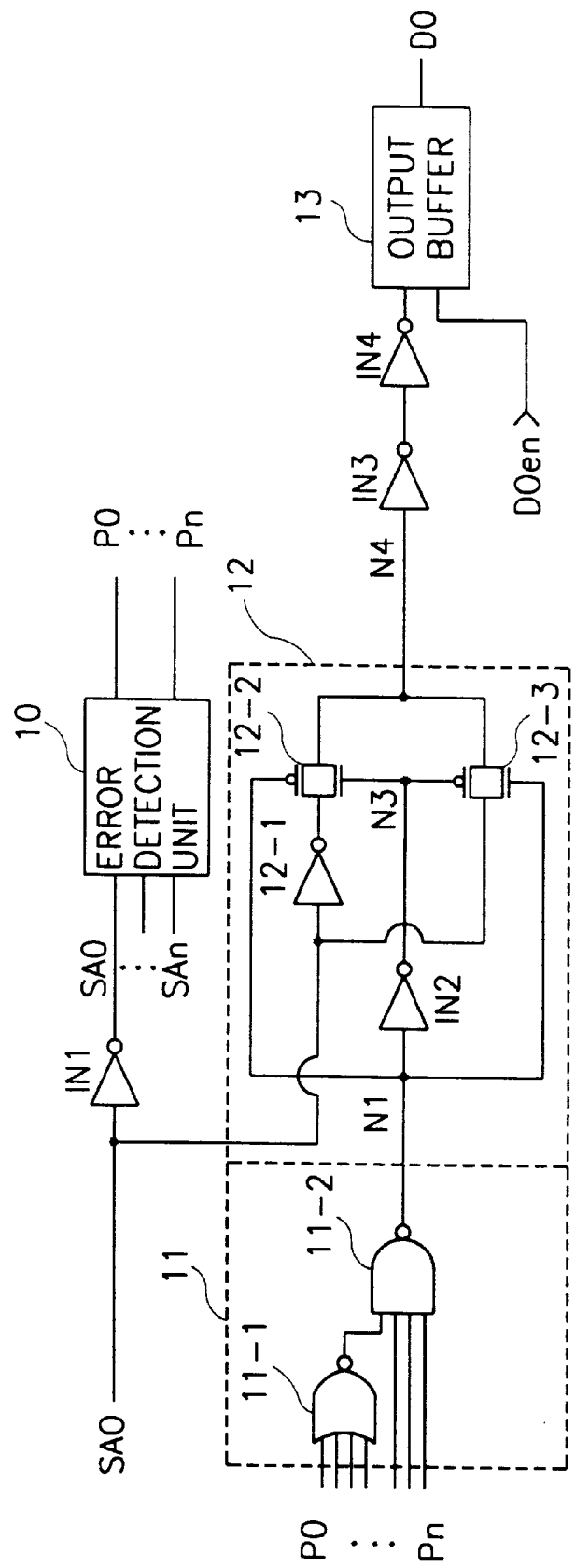
FIG. 1 is a circuit diagram illustrating a related art error data correction circuit.
Figure 2:
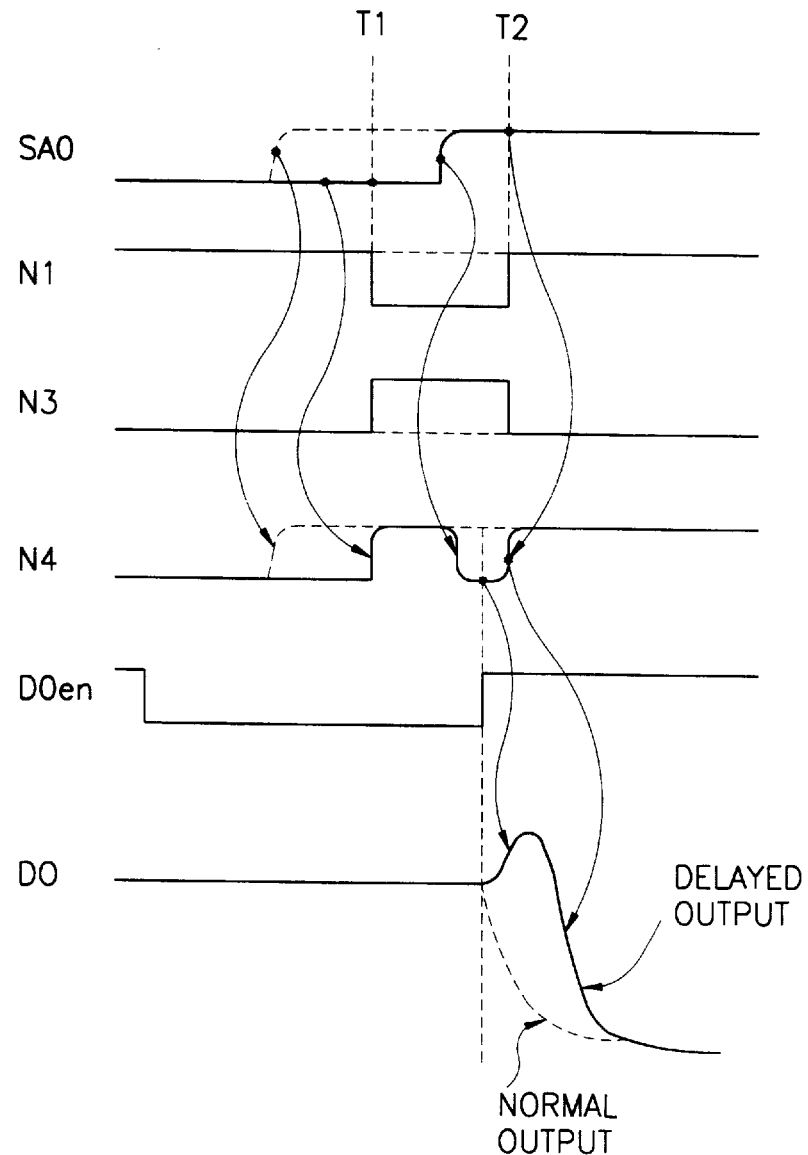
FIGS. 2A through 2F are diagrams illustrating waveform signals of elements of FIG. 1.
Figure 3:
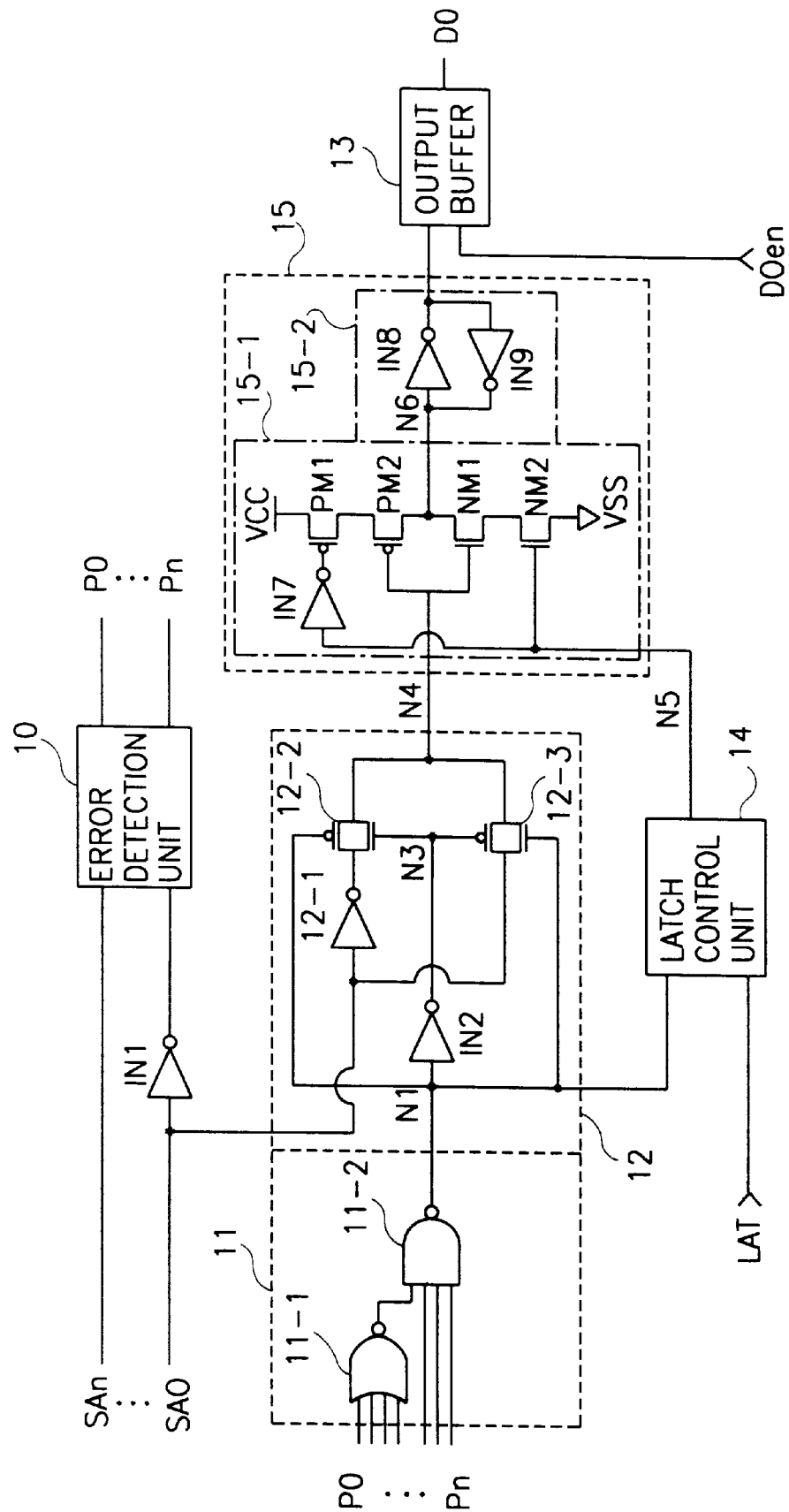
FIG. 3 is a circuit diagram illustrating a preferred embodiment of an error data correction circuit according to the present invention.

FIG. 3 illustrates a preferred embodiment of an error data correction circuit according to the present invention. As shown in FIG. 3, the preferred embodiment of the error data correction circuit includes an error detection unit 10, an error judgement unit 11, an error data correction unit 12, an output unit 13, a latch control unit 14 and a latch circuit 15. The latch control unit 14 combines an error judgement signal N1 from the error judgement unit 11 and a latch signal LAT, which is an inner control signal. The latch control unit 14 also outputs a latch control signal N5. The latch circuit 15 latches an output N4 from the error data correction unit 12 based on the latch control signal N5 and outputs the latched output to the output buffer 13. The error detection unit 10, the error judgement unit 11, the error data correction unit 12 and the output unit 13 are similar to the related art. Thus, a detailed description is omitted.

As shown in FIG. 4, the latch control unit 14 includes a delay unit 14-1 for delaying the error judgement signal N1 from the error judgement unit 11 and a NOR-gate 14-2 for NORing the output from the delay unit 14-1 and the error judgement signal N1. Inverters IN5 and IN6 sequentially invert the output from the NOR-gate 14-2. An NAND-gate 14-3 NANDs the output from the CMOS inverter IN6 and the latch signal LAT to output the latch control signal N5. The delay unit 14-1 is preferably formed of a 2n+1 plurality of CMOS inverters.

The latch circuit 15 includes an inverter unit 15-1, a latch unit 15-2 and a CMOS inverter IN7 that inverts the output from the NAND-gate 14-3. The inverter unit 15-1 includes PMOS transistors PM1 and PM2 and NMOS transistors NM1 and NM2 coupled in series between a power voltage Vcc and a ground voltage Vss. The gates of the PMOS transistor PM1 and the NMOS transistor NM2 respectfully receive an inverted latch control signal N5 and the latch control signal N5. The gates of the PMOS transistor PM2 and the NMOS transistor NM1 receive the output N4 from the error data correction unit 12. The latch unit 15-2 latches the output from the inverter unit 15-1. The latch unit 15-2 preferably includes inverters IN8 and IN9 coupled in reverse parallel.

Operations of the preferred embodiment of the error data correction circuit according to the present invention will now be described. When the output SA0 from the sense amplifier (not shown) is delayed and outputted as shown in FIG. 5B, the error judgement unit 11 outputs an error judgement signal N1 shown in FIG. 5C at the time T1. In FIGS. 5A–5F, the broken line denotes a normal data. At this time, a pulse signal generation unit (not shown) receives an address transition signal ATD, and outputs a latch signal LAT as shown in FIG. 5A.

Therefore, the transmission gate 12-2 of the error data correction unit 12 is turned on in accordance with a high level error judgement signal N1, which was inverted by the CMOS inverter IN2. Further, the output SA0 from the sense amplifier is inverted by the inverter 12-1 and is outputted through the transmission gate 12-2.

In other words, the output N4 from the error data correction unit 12 is shown in FIG. 5E. At the time T2 a normal data is outputted by the error data correction unit 12.

However, invalid data causes a glitch or an error from the time T1 to the time T2.

The latch control unit 14 shown in FIG. 4 combines the latch signal LAT, which is a control signal, and an error judgement signal N1 shown in FIG. 5C to output the latch control signal N5 as shown in FIG. 5F. Therefore, the PMOS transistor PM1 and the NMOS transistor NM2 of the latch circuit 15 are turned on during the interval when the latch control signal N5 is inputted. Further, the PMOS transistor PM2 and the NMOS transistor NM1 are turned on in accordance with the output N4 from the error data correction unit 12. The latch unit 15-2 latches the output N4 from the error data correction unit 12 that was outputted while the latch control signal N5 was a high level. Thus, the latch unit 15-2 outputs a signal N6 as shown in FIG. 5G.

The output buffer 13 receives the output N6 from the latch circuit 15. The output buffer 13 outputs the signal, as shown in FIG. 5I, in accordance with the output enable signal DOen. In addition, when the error data is outputted from the sense amplifier, the operation is performed the same as the previous operation.

As described above, the error data correction circuit according to the preferred embodiment of the present invention increases the data output speed by preventing noise. The preferred embodiment prevents noise by latching the output N4 from the error data correction unit 12 while the latch control signal N5 is high level and outputs the signal shown in FIG. 5G. In other words, the signal as shown in FIG. 5E is prevented.

Thus, the preferred embodiment of the error data correction circuit has various advantages. The error data correction circuit according to the present invention improves data output speed by latching and outputting the output from the error data correction unit in accordance with a latch control signal. The latch control signal is preferably generated by combining a control signal and an error judgement signal to prevent noise (glitch) that occurs from a final output terminal.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. An error data correction circuit, comprising:
    a Hamming code error data correction circuit that receives a first signal and selectively corrects an error in the received first signal based on a second signal to output a third signal;
    a latch controller that outputs a latch control signal based on the second signal; and
    a latch circuit that latches the third signal from the error data correction circuit based on the latch control signal is inputted from the latch controller.

2. The circuit of claim 1, further comprising:
    an error judgement circuit that receives an error detection signal and outputs the second signal, which is an error judgement signal, wherein the error data correction circuit corrects the first signal with the second signal.

3. The circuit of claim 2, further comprising an error detection unit that evaluates the first signal to output the error detection signal, wherein the error detection unit XORs the first signal.

4. The circuit of claim 2, wherein the latch controller comprises:
    a delay that delays the error judgement signal from the error judgement circuit;
    a first logic-gate that logically processes an output from the delay and the error judgement signal;
    a second logic-gate that logically processes an output from the first logic-gate and a latch signal; and
    an inverter that inverts an output from the second logic-gate and outputs the latch control signal.

5. The circuit of claim 1, further comprising:
    a sense amplifier that outputs the first signal; and
    an output buffer that outputs the third signal received from the latch circuit.

6. The circuit of claim 1, wherein the latch circuit includes:
    an inverter circuit, wherein the inverter circuit comprises first through fourth transistors coupled in series between a first reference voltage and a second reference voltage, wherein gates of the first and fourth transistors receive the latch control signal, and wherein gates of the second and third transistors receive the third signal; and
    a latch that latches an output from the inverter circuit.

7. The circuit of claim 1, wherein the latch controller combines the second signal and a latch signal to determine the latch control signal.

8. An error data correction circuit, comprising:
    an error judgement circuit that receives an error detection signal based on input signal and outputs an error judgement signal indicating whether there is an error in the input signal;
    an error data correction circuit connected to the error judgement circuit that selectively corrects the error in the input signal using the error judgement signal;
    a latch controller that outputs a latch control signal;
    a latch circuit that latches a corrected output from the error data correction unit based on the latch control signal from the latch control unit; and
    an output buffer that transmits the corrected output received from the latch controller.

9. The circuit of claim 8, wherein the latch controller comprises:
    a delay that delays the error judgement signal from the error judgement circuit;
    a first logic-gate that logically processes an output from the delay and the error judgement signal;
    a second logic-gate that logically processes an output from the first logic-gate and a latch signal; and
    an first inverter that inverts an output from the second logic-gate and outputs the latch control signal.

10. The circuit of claim 9, wherein the first logic-gate is a NOR-gate and the second logic-gate is an NAND-gate.

11. The circuit of claim 9, wherein the delay is formed of a plurality of inverters.

12. The circuit of claim 11, wherein the plurality of inverters are an odd number of inverters.

13. The circuit of claim 8, wherein the latch circuit includes:
    an inverter, wherein the inverter comprises first through fourth transistors coupled in series between a first reference voltage and a second reference voltage, wherein gates of the first and fourth transistors receive the latch control signal, and wherein gates of the second and third transistors receive an output from the error data correction circuit; and
    a latch that latches an output from the inverter.

14. The circuit of claim 13, wherein the first and second transistors are PMOS transistors, wherein the third and fourth transistors are NMOS transistors, and wherein the first and second reference voltages are a power voltage and a ground voltage, respectively.

15. The circuit of claim 8, further comprising:

a sense amplifier that outputs the input signal; and an error detector that evaluates the input signal and outputs the error detection signal.

16. The circuit of claim 15, wherein the error detector XORs the input signal.

17. The circuit of claim 8, wherein the error data correction circuit selectively corrects the input signal from the sense amplifier when an error occurs.

18. The circuit of claim 8, wherein the latch controller combines the error judgement signal and a latch signal to determine the latch control signal.

19. The circuit of claim 8, wherein the error judgement circuit and the error data correction circuit form a Hamming error code correction device.

* * * * *